(12) United States Patent
Okushima

(10) Patent No.: US 8,625,239 B2
(45) Date of Patent: Jan. 7, 2014

(54) SEMICONDUCTOR DEVICE

(75) Inventor: Mototsugu Okushima, Kanagawa (JP)

(73) Assignee: Renesas Electronics Corporation, Kanagawa (JP)

(*) Notice: Subject to any disclaimer, the term of this patent is extended or adjusted under 35 U.S.C. 154(b) by 309 days.

(21) Appl. No.: 13/011,622

(22) Filed: Jan. 21, 2011

(65) Prior Publication Data

US 2011/0180874 A1    Jul. 28, 2011

(30) Foreign Application Priority Data

Jan. 26, 2010  (JP) ................................. 2010-014394

(51) Int. Cl.
*H02H 9/04* (2006.01)

(52) U.S. Cl.
USPC .......................................................... 361/56

(58) Field of Classification Search
USPC ................................................ 361/56, 57, 58
See application file for complete search history.

(56) References Cited

U.S. PATENT DOCUMENTS

| | | | |
|---|---|---|---|
| 6,437,407 B1 * | 8/2002 | Ker et al. ....................... | 257/357 |
| 7,394,631 B2 | 7/2008 | Watanabe et al. | |
| 8,072,720 B2 * | 12/2011 | Okushima ....................... | 361/56 |
| 8,125,749 B2 * | 2/2012 | Okushima ....................... | 361/56 |
| 2007/0047162 A1 | 3/2007 | Watanabe et al. | |
| 2008/0217650 A1 | 9/2008 | Morishita | |
| 2008/0253044 A1 * | 10/2008 | Okushima ....................... | 361/56 |
| 2008/0285190 A1 * | 11/2008 | Okushima ....................... | 361/56 |
| 2011/0090609 A1 * | 4/2011 | Okushima ....................... | 361/56 |
| 2011/0133282 A1 * | 6/2011 | Okushima ....................... | 257/358 |
| 2011/0180874 A1 * | 7/2011 | Okushima ....................... | 257/355 |
| 2012/0050927 A1 * | 3/2012 | Okushima ....................... | 361/56 |
| 2013/0001697 A1 * | 1/2013 | Okushima ....................... | 257/358 |

FOREIGN PATENT DOCUMENTS

| | | |
|---|---|---|
| JP | 6-244371 | 9/1994 |
| JP | 2007-67095 | 3/2007 |
| JP | 2008-218886 | 9/2008 |
| JP | 2008-263068 | 10/2008 |

OTHER PUBLICATIONS

Yasuyuki et al. "A Low-Leakage SCR Design Using Trigger-PMOS Modulations for ESD Protection", EOS/ESD Symposium 07-376, 2007.

Japanese Office Action dated Oct. 21, 2013 in corresponding Japanese Application No. 2010-014394 with English translation of enclosed wavy lined portions.

* cited by examiner

*Primary Examiner* — Rexford Barnie
*Assistant Examiner* — Angela Brooks
(74) *Attorney, Agent, or Firm* — Young & Thompson

(57) ABSTRACT

It is desired to effectively suppress breaking of a protection target circuit caused by direct application of an ESD surge voltage to the circuit. The semiconductor device includes: a VDD pad; a signal output pad; a GND pad; a high-potential power source line; a signal line; a low-potential power source line; main ESD protection elements; a PMOS transistor; and an output circuit. The output circuit includes: an NMOS transistor N1 whose source is connected to the signal line, and whose drain is connected to the low-potential power source line; and an NMOS transistor N2 connected between the gate of the NMOS transistor N1 and the low-potential power source line. The source of the PMOS transistor is connected to the signal line, the drain thereof is connected to the gate of the NMOS transistor N1, and the gate and back gate thereof are connected to the high-potential power source line.

18 Claims, 17 Drawing Sheets

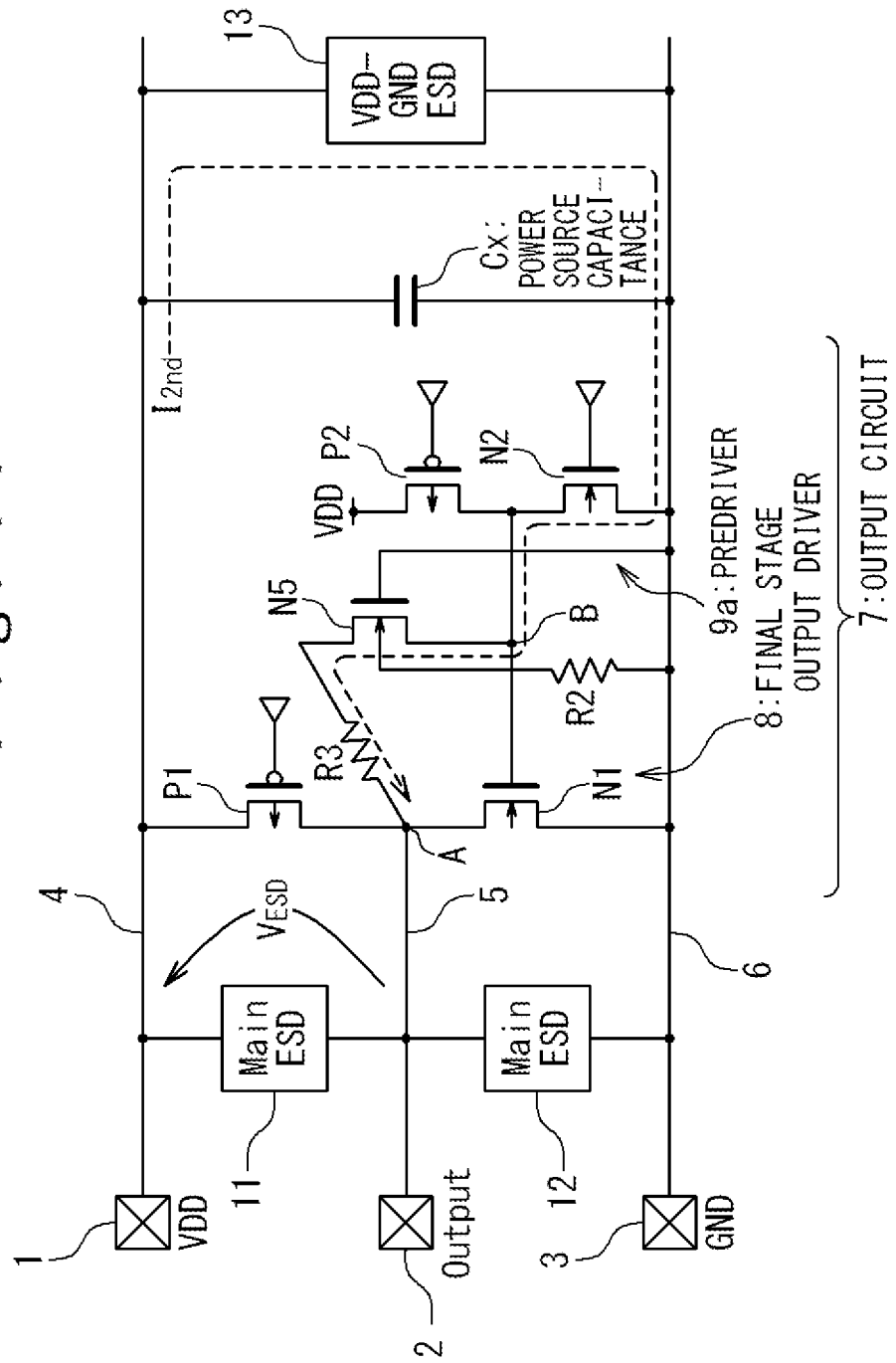

SEMICONDUCTOR DEVICE

INCORPORATION BY REFERENCE

This Patent Application is based on Japanese Patent Application No. 2010-014394. The disclosure of the Japanese Patent Application is incorporated herein by reference.

BACKGROUND OF THE INVENTION

1. Field of the Invention

The present invention relates to a semiconductor device. In particular, the present invention relates to an electrostatic discharge protection circuit for a semiconductor device.

2. Description of Related Art

In semiconductor devices, an electrostatic discharge protection circuit for protecting an internal circuit from the ESD (electrostatic discharge) surge applied to Input/Output pads is mounted. FIG. 1 shows a circuit diagram of a general configuration of a semiconductor device mounting an electrostatic discharge protection circuit.

The semiconductor device shown in FIG. 1 includes a VDD pad 101, a signal input pad 102, a GND pad 103, a high potential power source line 104, a signal line 105, a low potential power source line (ground line) 106, an output circuit 107, and an ESD protection elements 111, 112. The output circuit 107 is a circuit used for outputting a signal to an outside of the semiconductor device, and includes a final stage output driver 108 and a predriver 109. The final stage output driver includes a PMOS transistor P1 and an NMON transistor N1. The predriver 109 includes a PMOS transistor P2 and an NMOS transistor N2. The final stage output driver 108 drives the signal output pad 102 in a range from the GND potential to the VDD potential correspondingly to the value of a signal to be outputted to an outside. The predriver 109 drives a gate of the NMOS transistor N1 in response to a control signal supplied from an internal circuit (not shown). Though not shown, a predriver having a similar configuration as the predriver 109 is connected to a gate of the PMOS transistor P1. The ESD protection elements 111, 112 have a function to discharge an ESD surge inputted to the signal output pad 102 to the high potential power source line 104 or a low potential power source line 106 to protect the output circuit 107.

The off transistor is a typical element used for the ESD protection circuits 111, 112. The off transistor is a MOS transistor whose gate potential is fixed such that the transistor becomes an off-state under a normal operation, and discharges the ESD surge by a parasitic bipolar operation. Generally, when an NMOS transistor is used as the off transistor, the drain of the NMOS transistor is connected to a signal line, and the source and the drain thereof are connected to the low potential power source line (ground line). On the other hand, when a PMOS transistor is used as the off transistor, the drain of the PMOS transistor is connected to a signal line, and the gate and the source thereof are connected to the high potential power source line. The off transistor discharges the ESD surge by a parasitic bipolar operation when the ESD surge is applied to the drain thereof. By this principle, the off transistor functions effectively as an ESD protection element.

However, in a circuit configuration using an ESD protection element utilizing a parasitic bipolar operation, the design window becomes smaller in accordance with the downsizing of transistors. FIG. 2 is a graph showing a relationship between the breakdown voltage $V_{BD}$ of the gate insulating film and the clamp voltage $V_{clamp}$ (the voltage during a discharge by a parasitic bipolar operation) when an NMOS transistor is operated by a parasitic bipolar operation. Whereas the breakdown voltage $V_{BD}$ rapidly decreases with the decrease of the film thickness of the gate insulating film, the claim voltage $V_{clamp}$ does not decrease. As a result, the design window of an ESD protection circuit becomes smaller in association with the decrease of the film thickness of a gate insulating film.

As a means for solving such a problem, a circuit configuration is known in which a thyristor is used as an ESD protection element and a trigger current is supplied by a trigger element which operates at a low voltage (referring patent document 1: Japanese Patent Application Publication JP-P2008-218886A, and non-patent document 1: EOS/ESD Symposium 07-376, "A Low-Leakage SCR Design Using Trigger-PMOS Modulations for ESD Protection"). FIG. 3 shows a circuit diagram of an electrostatic discharge protection circuit of such a circuit configuration. The electrostatic discharge protection circuit in FIG. 3 includes: a VDD pad 201; a signal pad 202; a GND pad 203; a high potential power source line 204; a signal line 205; a low potential power source line (ground line) 206; a thyristor 207; a diode for ESD protection D1; and a PMOS transistor P1.

In the electrostatic discharge protection circuit of FIG. 3, the PMOS transistor P1 functions as a trigger element which supplies a trigger current to the thyristor 2047. In detail, when an ESD surge is applied to the signal pad 202, the PMOS transistor P1 turns on, and a trigger current is supplied to the thyristor 207. The PMOS transistor P1 supplies a trigger current not by a parasitic bipolar operation, but by a normal MOS transistor operation. Accordingly, the electrostatic discharge protection circuit in FIG. 3 can be operated at a low voltage (concretely, the sum of the forward voltage of the PN junction in the thyristor 2047 and the threshold voltage of the MOS transistor). In addition, because the thyristor 207 is used, it is possible to flow a large current, so that the capacity of the electrostatic discharge protection is high.

SUMMARY

However, according to an investigation of the present inventor, another problem exists in the circuit configuration in FIG. 1. Specifically, in the circuit configuration of FIG. 1, the ESD surge voltage $V_{ESD}$ when an ESD surge is applied is directly applied to the element of a protection target so that there is a possibility that the element of a protection target is broken. More specifically, under a condition that a power source voltage is not supplied to the semiconductor device in FIG. 1, the gate of the NMOS transistor N2 in the predriver 109 is floating, so that there is a case that the NMOS transistor N2 turns into the ON state. In this case, when an ESD surge being positive to the GND pad 103 is applied to the signal output pad 102, the voltage $V_{ESD}$, at which the main ESD protection element clamps an ESD surge, is applied between the drain and the gate of the NMOS transistor N1. At this timing, if the ESD protection element 112 is not able to perform the clamping to become a low voltage at which the NMOS transistor N1 is not broken, a large stress voltage $V_{stress}$ is applied to the NMOS transistor N1 in the output circuit 107, so that the NMOS transistor N1 becomes broken.

The above explained problem is not solved even in the circuit configuration shown in FIG. 3. In the circuit configuration in FIG. 3, in a case where the performance of the thyristor 207 is dropped off by taking an advantage of the area or a parasitic region, or in a case where the surge is large, the clamp voltage becomes high, the ESD surge voltage $V_{ESD}$ is applied to an internal circuit, so that the internal circuit may be broken.

For solving such a problem, according to an aspect of the present invention, a semiconductor device includes: a high potential power source line; a first power source line pad connected to the high potential power source line; a low potential power source line; a second power source line pad connected to the low potential power source line; a signal line; a signal pad connected to the signal line; a main protection circuit part which discharges an ESD surge applied to a first pad which is any of the first power source line pad, the second power source line pad, and the signal pad to a second pad which is any of the first power source line pad, the second power source line pad, and the signal pad and other than the first pad; and a sub protection circuit part; and a protection target circuit. The protection target circuit includes: an output MOS transistor whose drain is connected to the signal line, and whose source is connected to one power source line being one of the high potential power source line and the low potential power source line; and a circuit element connected between a gate of the output MOS transistor and the one power source line and configured to function as a resistive element. The sub protection circuit includes a first PMOS transistor being connected between the signal line and the gate of the output MOS transistor and whose gate and back gate are connected to the high potential power source line.

According to this configuration, when an ESD surge is applied to a signal output pad, the first PMOS transistor in the sub protection circuit part operates at a relatively low voltage (around the threshold voltage of the MOS transistor), so that a discharge path through the first PMOS transistor and a circuit element functions as a resistive element is formed. When a discharge current flows through this discharge path, the potential difference between the drain and the gate of the output MOS transistor decreases caused by the voltage drop in the circuit element functions as a resistive element, so that a circuit of the protection target is effectively protected.

Further, it is possible to use an NMOS transistor for the sub protection circuit part. In such a case, according to another aspect of the present invention, a semiconductor device includes: a high potential power source line; a first power source line pad connected to the high potential power source line; a low potential power source line; a second power source line pad connected to the low potential power source line; a signal line; a signal pad connected to the signal line; a main protection circuit part which discharges an ESD surge applied to a first pad which is any of the first power source line pad, the second power source line pad, and the signal pad to a second pad which is any of the first power source line pad, the second power source line pad, and the signal pad and other than the first pad; and a sub protection circuit part; and a protection target circuit. The protection target circuit includes: an output MOS transistor whose drain is connected to the signal line, and whose source is connected to one power source line being one of the high potential power source line and the low potential power source line; and a circuit element connected between a gate of the output MOS transistor and the one power source line and configured to function as a resistive element. The sub protection circuit includes a first NMOS transistor being connected between the signal line and the gate of the output MOS transistor and whose gate and back gate are connected to the low potential power source line.

According to the present invention, it is possible to effectively suppress the breaking of a circuit of the protection target caused by the ESD surge voltage directly applied to the circuit of the protection target.

BRIEF DESCRIPTION OF THE DRAWINGS

The above and other objects, advantages and features of the present invention will be more apparent from the following description of certain preferred embodiments taken in conjunction with the accompanying drawings, in which:

FIG. 11 is a circuit diagram showing another configuration of a semiconductor device according to the fourth embodiment of the present invention;

DESCRIPTION OF THE PREFERRED EMBODIMENTS

Figure 1:
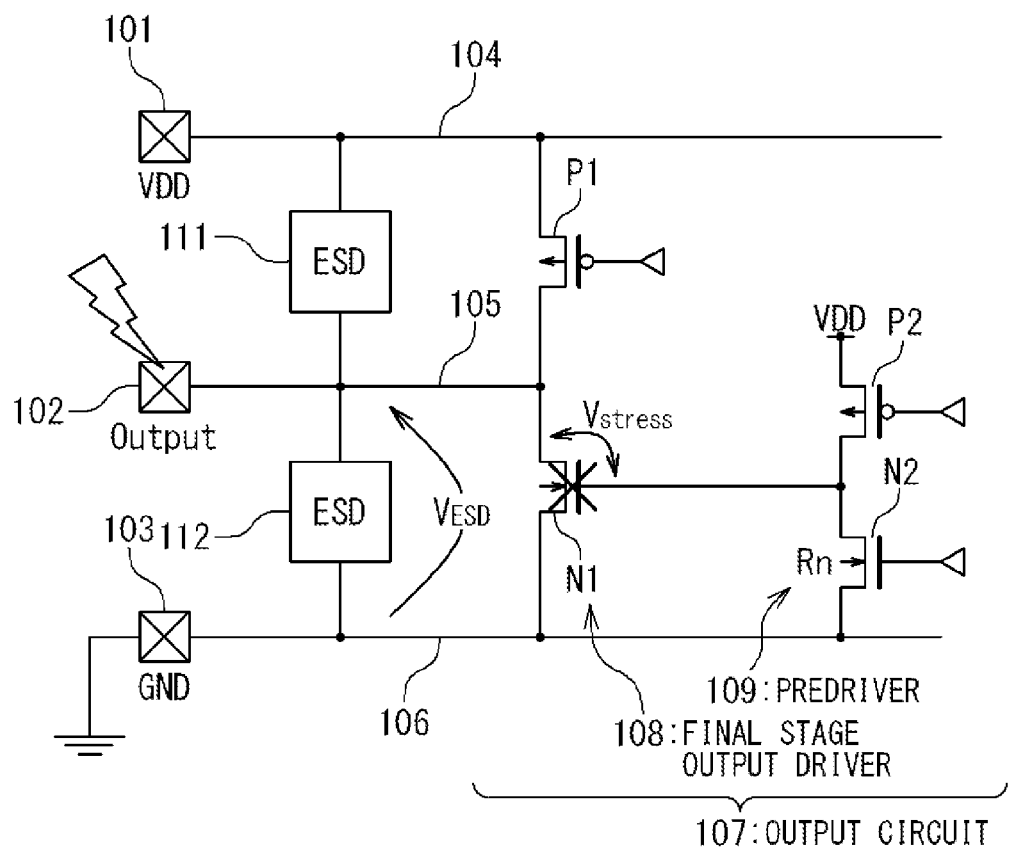
FIG. 1 is a circuit diagram showing an example of a common configuration of a semiconductor device mounting an electrostatic discharge protection circuit.
Figure 2:
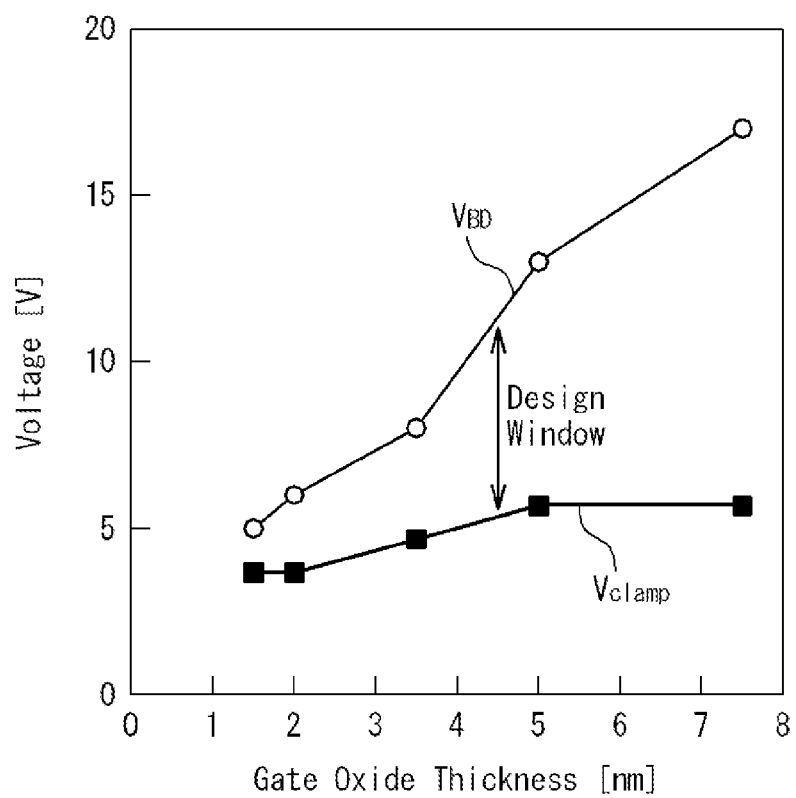
FIG. 2 is a graph showing a relationship between a breakdown voltage $V_{BD}$ of a gate insulating film and the claim voltage $V_{clamp}$ in a case where an NMOS transistors operates as a parasitic bipolar.
Figure 3:
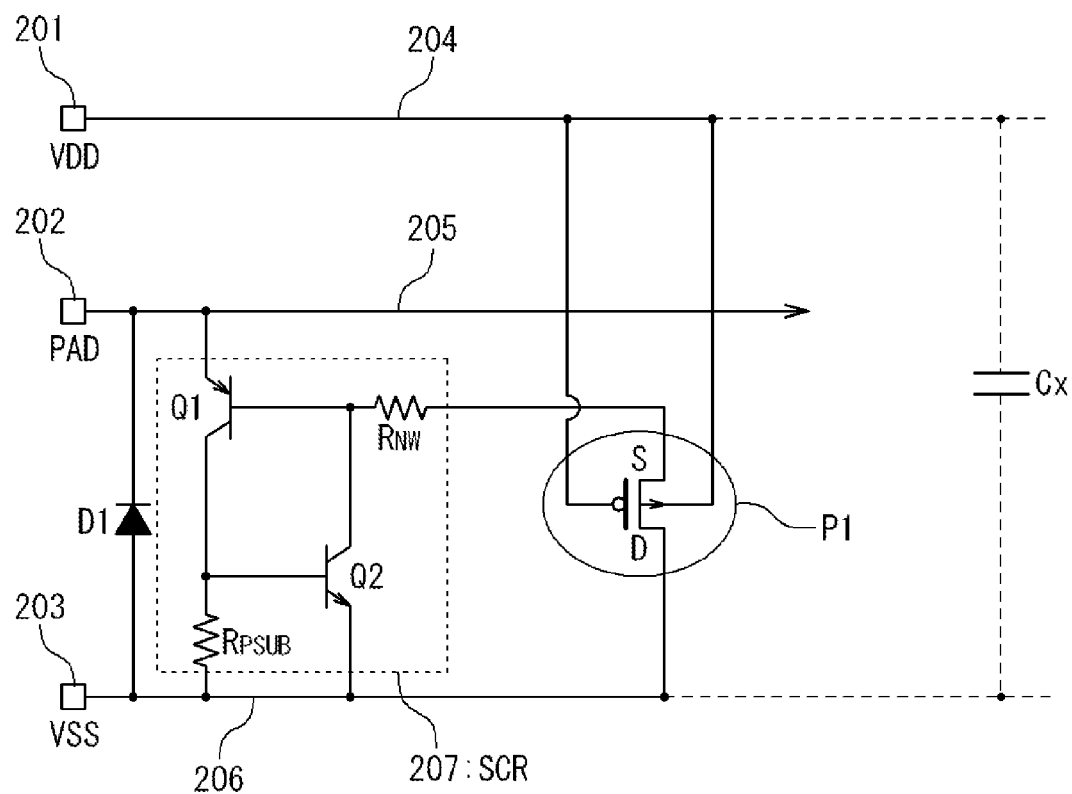
FIG. 3 is a circuit diagram showing an example of a known configuration of a semiconductor device mounting an electrostatic discharge protection circuit.
Figure 4:
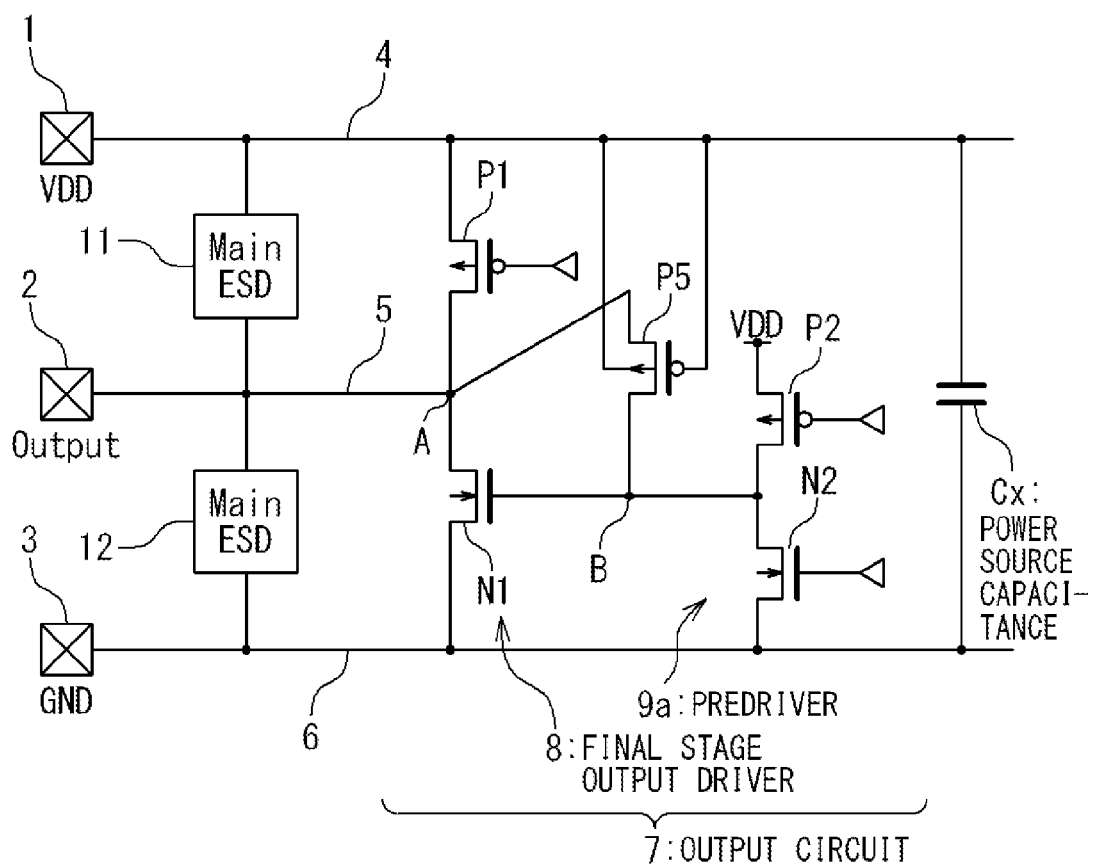
FIG. 4 is a circuit diagram showing a configuration of a semiconductor device according to a first embodiment of the present invention.

First Embodiment:

FIG. 4 is a circuit diagram showing a configuration of a configuration of a semiconductor device according to a first embodiment of the present invention, specifically, a configuration of an electrostatic discharge protection circuit integrated on the semiconductor device. In the present embodiment, the semiconductor device includes: a VDD pad 1; a signal output pad 2; a GND pad 3; a high potential power source line 4; a signal line 5; a low potential power source line (ground line) 6; and an output circuit 7. The VDD pad 1, the signal output pad 2, and the GND pad 3 are respectively connected to the high potential power source line 4, the signal line 5, and the low potential power source line 6.

The output circuit 7 is a circuit used for outputting a signal to an outside, and includes a final stage output driver 8 and a predriver 9a. The final stage output driver 8 includes a PMOS transistor P1 and an NMOS transistor N1 as output transistors, and drives the signal output pad 2 from a GND potential to the VDD potential in accordance with a signal value to be outputted to the outside. In detail, the PMOS transistor P1 is formed between the signal line 5 and the high potential power source line 4, whose source is connected to the high potential power source line 4, and whose drain is connected to the node A of the signal line 5. The PMOS transistor P1 has a function to pull up the signal output pad 2 to the VDD potential. On the other hand, the NMOS transistor N1 is formed between the signal line 5 and the low potential power source line 6, whose source is connected to the low voltage power source line 6, and whose drain is connected to the node A of the signal line 5. The NMOS transistor N1 has a function to pull down the signal output pad 2 to the VDD potential.

The predriver 9a drives a gate of the NMOS transistor N1 of the final stage output driver 8 in accordance with a control signal supplied from an internal circuit (not shown). The predriver 9a includes a PMOS transistor P2 and an NMOS transistor N2. The source of the PMOS transistor P2 is connected to a power source line, and the drain thereof is connected to the node B connected to the gate of the NMOS transistor N1. The PMOS transistor P2 has a function to pull up the gate of the NMOS transistor N1 to the VDD potential. On the other hand, the source of the NMOS transistor N2 is connected to the low potential power source line 6, and the drain thereof is connected to the node B. The NMOS transistor N2 has a function to pull down the gate of the NMOS transistor N1 to the GND potential. Though not shown, a predriver having a similar configuration to the predriver 9a is connected to the gate of the PMOS transistor P1.

The main ESD protection elements 11, 12, and the PMOS transistor P5 are formed to protect the output circuit 7, especially to protect the NMOS transistor N1 of the output circuit 7. The main ESD protection element 11 is inserted between the signal line 5 and the high potential power source line 4, and the main ESD protection element p12 is inserted between the signal line 5 and the low potential power source line 6. The source of the PMOS transistor P5 is connected to the node A of the signal line 5, and the drain thereof is connected to the node B connected to the gate of the NMOS transistor N1, and the gate and the back gate thereof are connected to the high potential power source line 4.

The main ESD elements 11, 12 form a main protection circuit part having a function to flow a discharge current mainly to the high potential power source line 4 or a low potential power source line 6 when an ESD surge is applied to the signal output pad 2. The main ESD protection elements 11, 12 are formed to be able to flow a large current.

On the other hand, the PMOS transistor P5 is a sub ESD protection element inserted for the purpose of relaxing a stress voltage applied to the output circuit 7. The PMOS transistor P5 forms a sub protection circuit part which additionally performs discharge when an ESD surge is applied to the signal output pad 2. The PMOS transistor P5 is formed so that a relatively small current flows compared with the main ESD protection elements 11, 12. As described later, the PMOS transistor P5 provides a path for flowing a tiny current to the low potential power source line 6 via the NMOS transistor N2 when an ESD surge is applied to the signal output pad 2. As a result, the PMOS transistor P5 has a function to relax the stress voltage $V_{stress}$ applied to elements forming the output circuit 7, especially to the NMOS transistor N1.

As for the PMOS transistor P5 which functions as a sub ESD protection element, depending on the operation, there is a case in which the node A is higher than the node B in voltage and also a case in which the node B is higher than the node A. Therefore, even a terminal of the PMOS transistor P5 is described as the "source", it merely means that it is one of the "source" and the "drain". It is same for the "drain".

In the followings, operations of the semiconductor device according to the present embodiment, specifically, operations of the PMOS transistor P5 forming a sub protection circuit part is explained in detail.

At first, operations in a normal operation period are explained. In the normal operation period, requirements for the PMOS transistor P5 is that it is turned off and its off leakage current is small. As explained below in detail, the circuit configuration shown in FIG. 4 satisfies such requirements.

Figure 5:
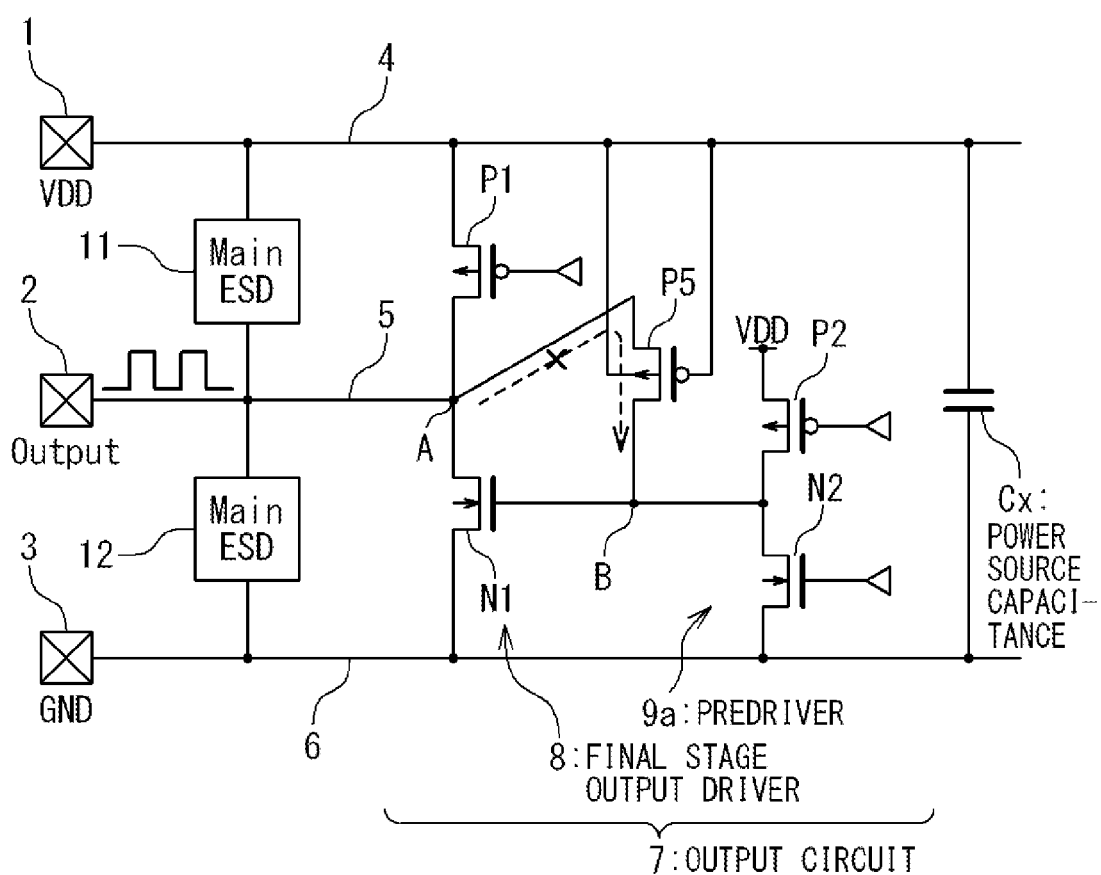
FIG. 5 is a circuit diagram showing a normal operation of a semiconductor device according to the first embodiment of the present invention.

Specifically, as shown in FIG. 5, in the normal operation period, the high potential power source line 4 is fixed to the VDD potential, the low potential power source line 6 is fixed to the GND potential, and a signal of the amplitude between the maximum value of the VDD potential and the minimum value of the GND potential is outputted from the signal output pad 2. In this time, because the source potential of the PMOS transistor P5 (the potential of the node A) is same to or less than the gate potential thereof (the VDD potential), the PMOS transistor P5 is turned off.

Note that the back gate potential of the PMOS transistor P5 (the VDD potential) is higher than its source potential (the potential of the signal line 5) in the normal operation period. As a result, by the back-gate effect, the absolute value of the threshold voltage of the PMOS transistor P5 becomes larger, and the off-leakage current of the PMOS transistor P5 becomes smaller. The decrease of the leakage current caused by the back-gate effect is especially effective for a case where the semiconductor device according to the present embodiment is used as an output interface of a low voltage differential signaling. When a low voltage differential signal is outputted, a bias voltage (the common mode voltage) is fixed to an intermediate point of the VDD voltage and the GND voltage, and the external output signal is supplied as a signal of a smaller amplitude than the bias voltage. Therefore, the back gate effect is high, and the merits of the decrease of the off-leakage voltage can be further enjoyed.

Figure 6:
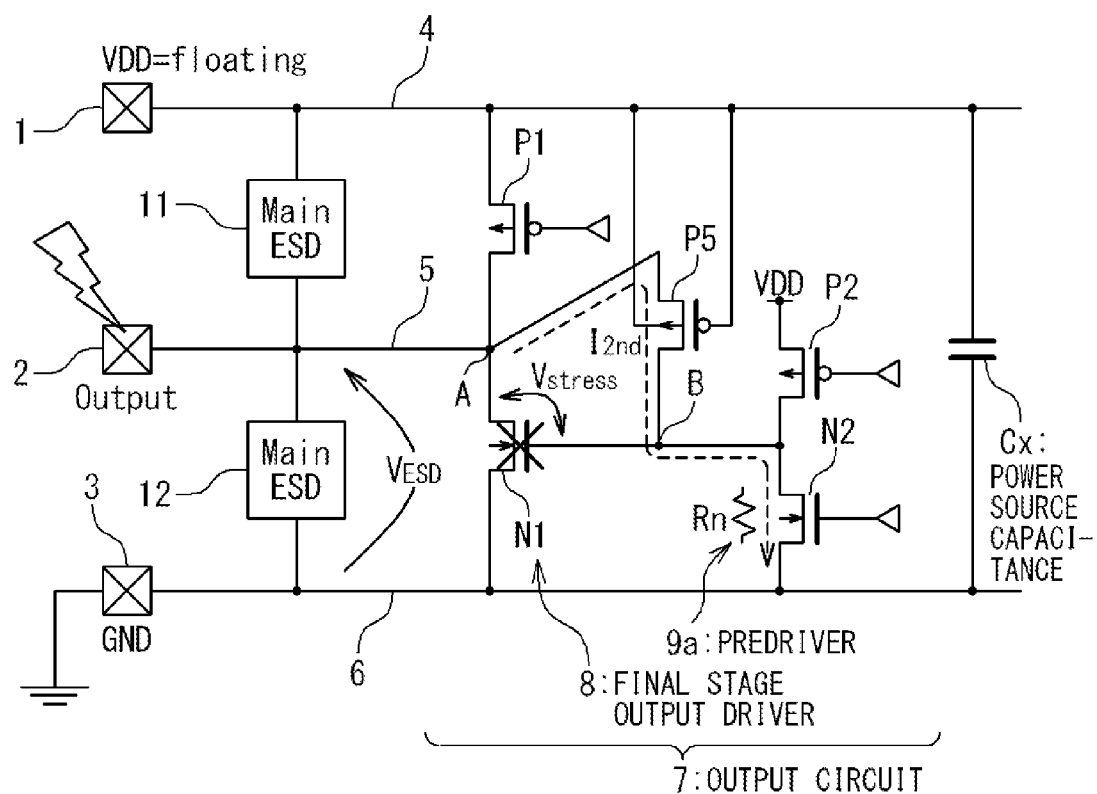
FIG. 6 is a circuit diagram showing an operation of a semiconductor device according to the first embodiment of the present invention when an ESD surge is applied.

On the other hand, FIG. 6 shows operations in a case where an ESD surge positive to the GND pad 3 is applied to the signal output pad 2. In this case, note that the high potential power source line 4 is floating and not supplied with a power source voltage. In FIG. 6, Cx is a power source capacitance formed between a high potential power source line 4 and the low potential power source line 6 as a parasitic capacitor or an intentionally formed capacitor. The potential of the high potential power source line does not increase until the power source capacitance Cx is fully charged.

Further, note that the gate of the NMOS transistor N2 in the predriver 9a is floating. When the gate of the NMOS transistor N2 is floating, there is a case that the NMOS transistor N2 turns on. As described above, when the NMOS transistor N2 is turned on when an ESD surge is applied to the signal output pad 2, a stress voltage is applied to the gate-drain of the NMOS transistor N1 of the final stage output driver 8. The semiconductor device according to the present invention performs an operation to protect the NMOS transistor N1 from this stress voltage. Therefore, in the following description, NMOS transistor N2 is assumed to be turned on.

When an ESD surge is applied, the voltage $V_{ESD}$ between the signal line 5 and the low potential power source line 6 starts increasing while discharge is performed at the main ESD protection elements 11, 12. While the voltage $V_{ESD}$ increasing, the high potential power source line 4 is pulled to the GND potential by the power source capacitance Cx. Therefore, as shown in FIG. 6, the potential of the signal line 5 becomes higher than the potential of the high potential power source line 4. When the potential difference between the signal line 5 and the high potential power source line 4 exceeds the threshold voltage Vt of the PMOS transistor P5, the PMOS transistor P5 turns on and performs a MOS operation.

When the PMOS transistor turns on, a discharge path from the signal output pad 2, via signal line 5, the PMOS transistor P5, and the NMOS transistor N2 to the low potential power source line 6 is formed. When a discharge current $I_{2nd}$ flows through this discharge path, the potential of the node B becomes higher than the potential of the low potential power source line 6 caused by the channel resistance Rn of the NMOS transistor N2, and the stress voltage $V_{stress}$ applied between the source-drain of the NMOS transistor N1 is decreased. As a result, the breaking of the NMOS transistor N1 is effectively prevented. Note that, only a small discharge current flows through the discharge path passing through the PMOS transistor P5, and almost all of the discharge current generated by the application of the ESD surge flows through the discharge pass passing through the main ESD protection element 12.

In this operation, it is important that the PMOS transistor P5 provides a discharge path based on a normal MOS operation (not based on a parasitic bipolar operation). Because the PMOS transistor P5 operates based on the MOS operation, the PMOS transistor P5 operates at a low voltage, so that the protection effect of the NMOS transistor N1 is high. If a discharge path is provided based on the parasitic bipolar operation as a case of the off transistor, the operation voltage becomes high to a value about 4V, and the relaxation effect of the stress voltage $V_{stress}$ applied to the NMOS transistor N1 is not enough. On the other hand, according to the configuration of the present embodiment (FIG. 4 to FIG. 6), the PMOS transistor P5 performs a MOS operation and the PMOS transistor P5 operates at a low voltage, so that the relaxation effect of the stress voltage $V_{stress}$ is high.

In the circuit configuration according to the present embodiment shown in FIGS. 4 to 6, there is a possibility that the following problem occurs. If the claim voltage of the PMOS transistor P5 which functions as a sub ESD protection element is too small compared with the clamp voltage of the main ESD protection elements 11, 12, most of a discharge current flows into the PMOS transistor P5. As a result, the PMOS transistor P5 is broken down before the main ESD protection elements 11, 12 starts to operate.

However, this problem is not important in actual. In association with the progress of miniaturization and adopting of lower power source voltage, thyristor type protection elements have become available, and it has become possible for the voltage increase at a discharge to be lower than about 7V. In addition, in association with further miniaturization and lower power source voltage, further decrease of the operation voltage of the main ESD protection elements 11, 12 can be expected. When the main ESD protection elements 11, 12 having a low clamp voltage of about 7V, even a PMOS transistor P5 in the present embodiment whose operation start voltage is about the threshold voltage is adopted, the difference between the claim voltages of the main ESD protection elements 11, 12 and the PMOS transistor P5 becomes small value about 6V, so that the problem of breaking of the PMOS transistor P5 does not occur.

Figure 7:
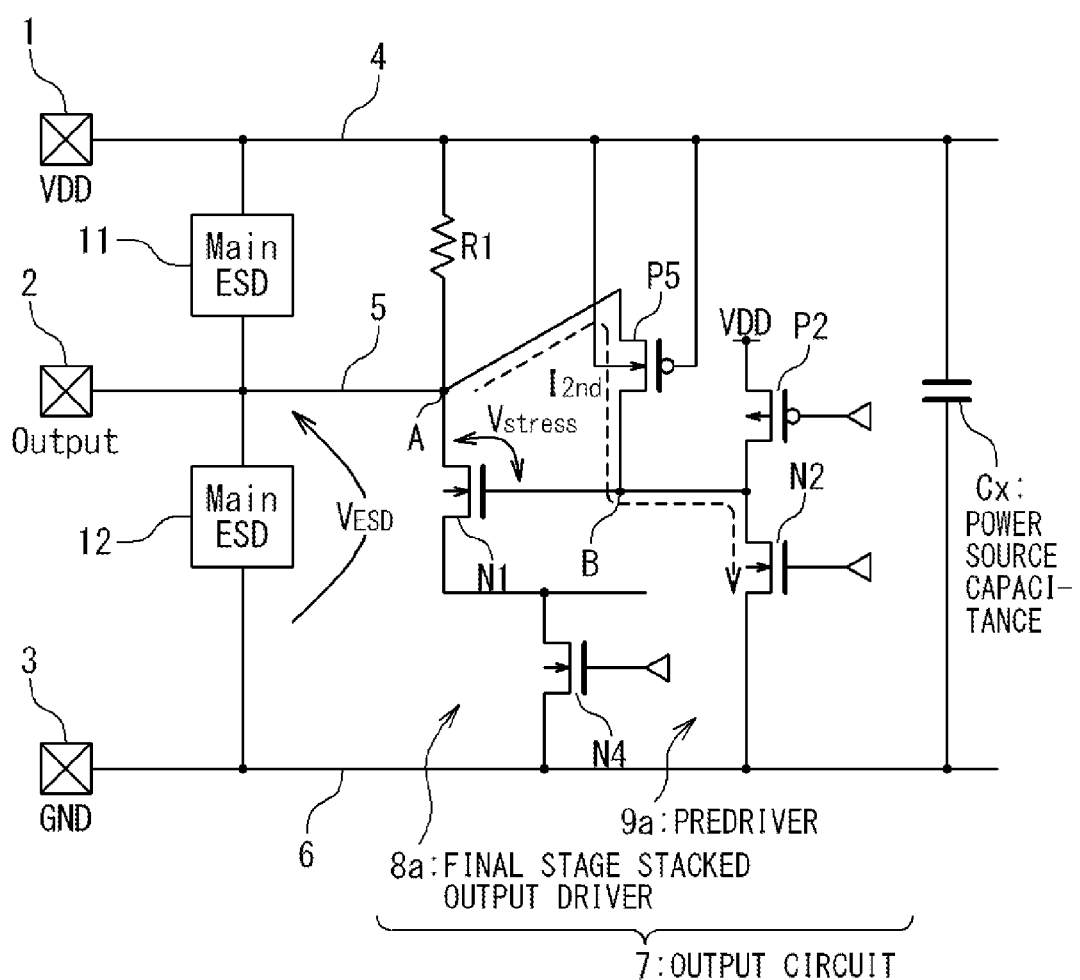
FIG. 7 is a circuit diagram showing a modified example of a semiconductor device according to the first embodiment.

The protection of an output NMOS transistor using the MOS operation of a PMOS transistor as described in the present embodiment can be applied to output circuits having other circuit configuration, for example, in a case where an output NMOS transistor is connected between a signal line and a low potential power source line. For example, as shown in FIG. 7, the present invention can be applied for a protection of the NMOS transistor N1 of the final stage stacked output driver 8a which includes NMOS transistors N1, N4 connected between the signal line 5 and the low potential power source line 6 in cascade and the resistive element R1 connected between the high potential power source line 4 and the signal line 5. In this configuration, the NMOS transistor N4 functions as a current source, and the resistive element R1 functions as a load. Also in such a configuration, when an ESD surge positive to the GND pad 3 is applied to the signal output pad 2, the PMOS transistor P5 performs the MOS operation, and a discharge path from the signal output pad 2 via the signal line 5, the PMOS transistor P5, and the NMOS transistor N2 to the low potential power source line 6 is formed. When a discharge current $I_{2nd}$ flows through this discharge path, the potential of the node B (the gate of the NMOS transistor) increases caused by the channel resistance Rn of the NMOS transistor N2 so that the stress voltage $V_{stress}$ applied between the drain-gate of the NMOS transistor N1 is relaxed. As a result, the NMOS transistor N1 is protected.

Further, though a circuit configuration in which a discharge current $I_{2nd}$ flows via the NMOS transistor N2 is demonstrated in the first embodiment, other kind of element which can functions as a resistive element can be used instead of the NMOS transistor N2. In the operation of the present embodiment, the NMOS transistor N2 functions merely as a resistive element. For example, in the predriver 9a, a resistive element or a NMOS transistor in a diode connection may be used instead of the NMOS transistor N2. However, for decreasing the power consumption by adopting a CMOS circuit configuration to the predriver 9a, the configurations in FIG. 4 to FIG. 6 which use the NMOS transistor N2 are preferred.

Figure 8:
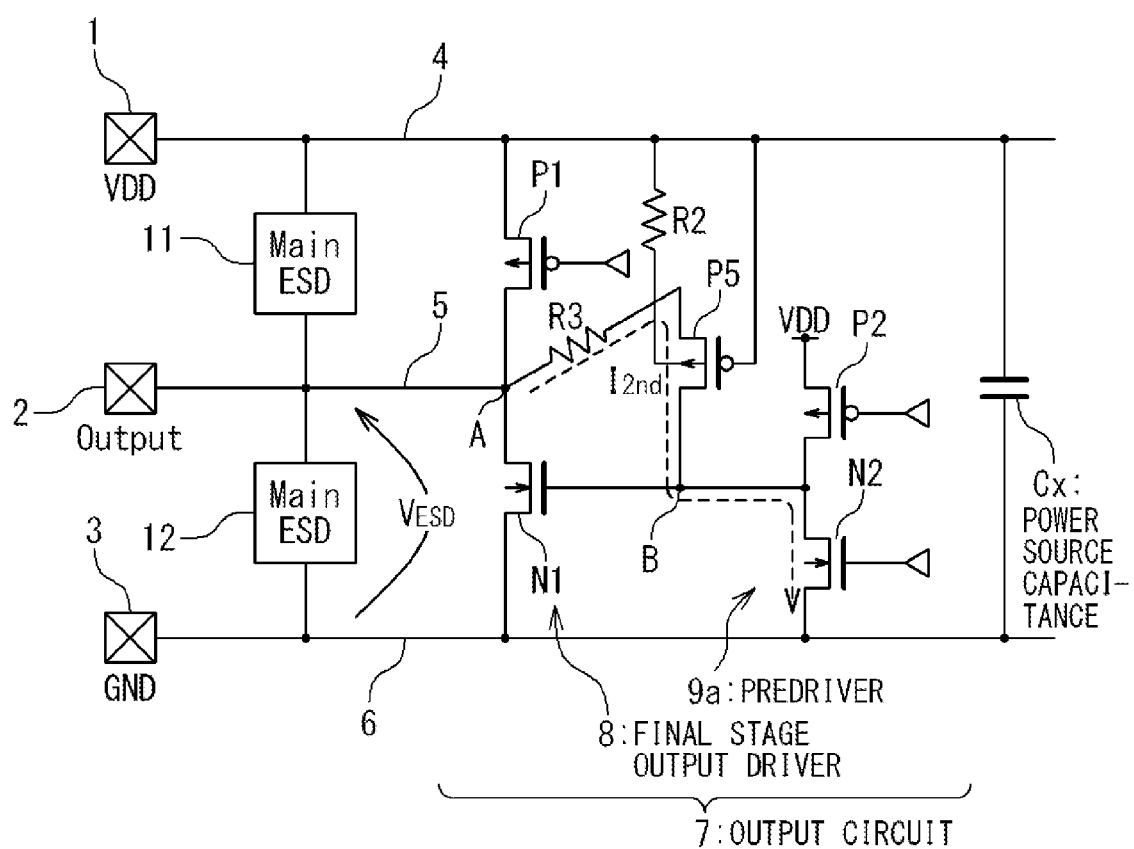
FIG. 8 is a circuit diagram showing a configuration of a semiconductor device according to a second embodiment of the present invention.

Second Embodiment:

FIG. 8 is a circuit diagram showing a configuration of a semiconductor device according to a second embodiment of the present invention. In the circuit configuration according to the first embodiment, when further higher speed, for example 10 GHz, is considered, it is required to drastically decrease parasitic capacitances of the main ESD protection element, and in association with that, it is also required to decrease the size of the main ESD protection element. In this case, the discharge capability of the main ESD protection element drops down, so that there is a possibility that an excessive discharge current flows into the PMOS transistor P5. When an excessive discharge current flows into the PMOS transistor P5, there is a possibility that the PMOS transistor P5 itself which functions as a sub ESD protection element is broken down. To cope with this problem, in the second embodiment, a means is adopted to prevent an excessive discharge current from flowing into the PMOS transistor P5.

More specifically, the resistive element R2 is inserted between the back gate of the PMOS transistor P5 and the high potential power source line 4, and the resistive element R3 is inserted between the node A of the signal line 5 and the gate of the NMOS transistor N1 (the node B) in series with the PMOS transistor P5. In FIG. 8, the resistive element R3 is inserted between the source of the PMOS transistor P5 and the node A. However, the resistive element R3 may be inserted between the drain of the PMOS transistor P5 and the node B. The amount of the discharge current flows through the PMOS transistor P5 can be intentionally restricted by the resistive elements R2, R3, so that the breaking of the PMOS transistor P5 can be prevented. Note that, though two resistive elements R2, R3 are inserted in FIG. 8, it is possible to insert only one of them for achieving the effect of the present embodiment.

Figure 9A:
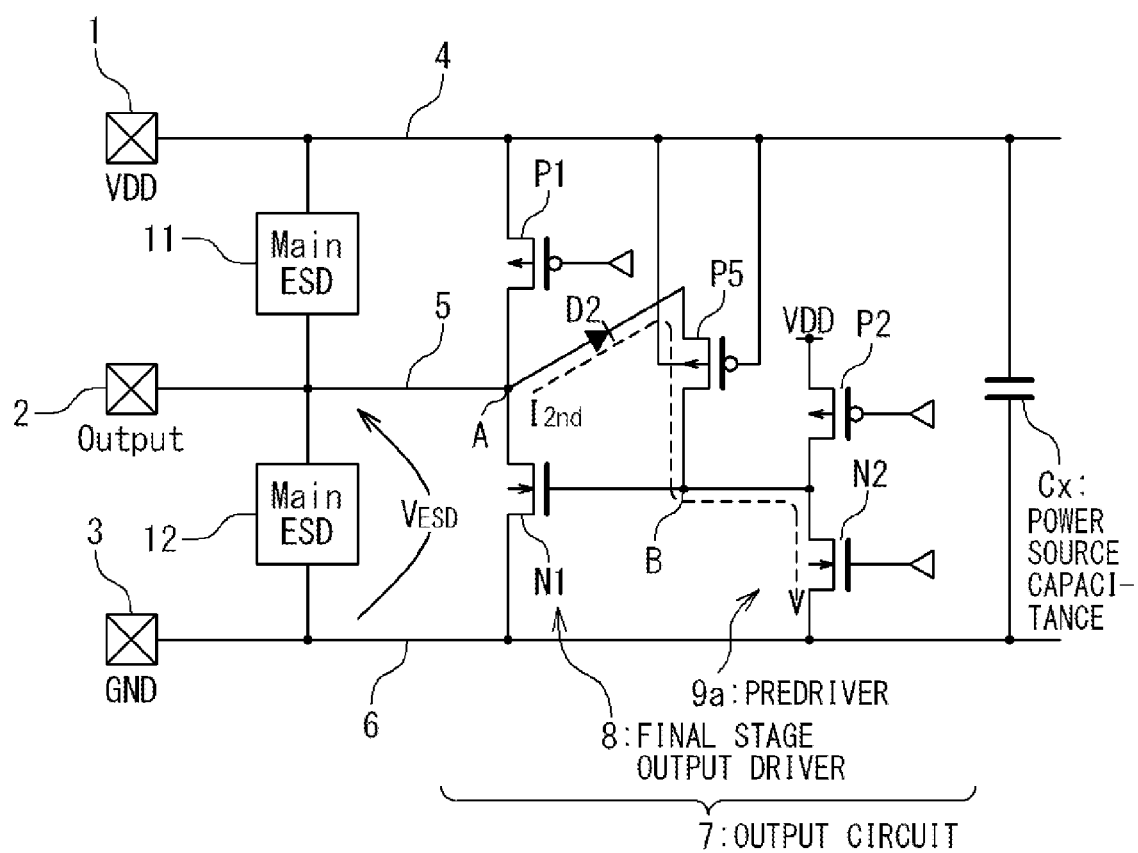
FIG. 9A is a circuit diagram showing a configuration of a semiconductor device according to a third embodiment of the present invention.

Third Embodiment:

FIG. 9A is a circuit diagram showing a configuration of a semiconductor device according to a third embodiment of the present invention. In the third embodiment, the diode D2 is inserted between the node A of the signal 5 and the gate of the NMOS transistor N1 (the node B) in series with the PMOS transistor P5. The diode D2 is inserted so that its forward direction is from the node A to the node B.

The diode D2 has a function to prevent the PMOS transistor P5 from erroneous operations when the potential of the signal output pad 2 becomes higher than the VDD potential during a normal operation period caused by, for example, a noise. During the normal operation period, the potential of the signal output pad 2 is the VDD potential at the highest. However, there may be a case where it exceeds the VDD potential caused by a noise or the like. In the configuration of the first embodiment, when a noise level is high and the potential of the node A of the signal line 5 exceeds the sum of the VDD potential and the threshold voltage Vt of the PMOS transistor P5, an erroneous operation by which the PMOS transistor P5 turns on even in the normal operation mode can occur.

The diode D2 has a function to prevent the PMOS transistor P5 from such an erroneous operation effectively. In the configuration of FIG. 9A where the diode D2 is inserted, the operation voltage of the PMOS transistor P5 increases by the forward voltage Vf of the diode D2, and an occurrence of the erroneous operation is suppressed. Though only one diode D2 is inserted in FIG. 9A, by inserting N number of diodes instead, it is possible to increase the operation voltage of the PMOS transistor P5 by N×Vf. The number of inserted diodes D2 is appropriately adjusted in accordance with a desirable operation voltage of the PMOS transistor P5.

Figure 9B:
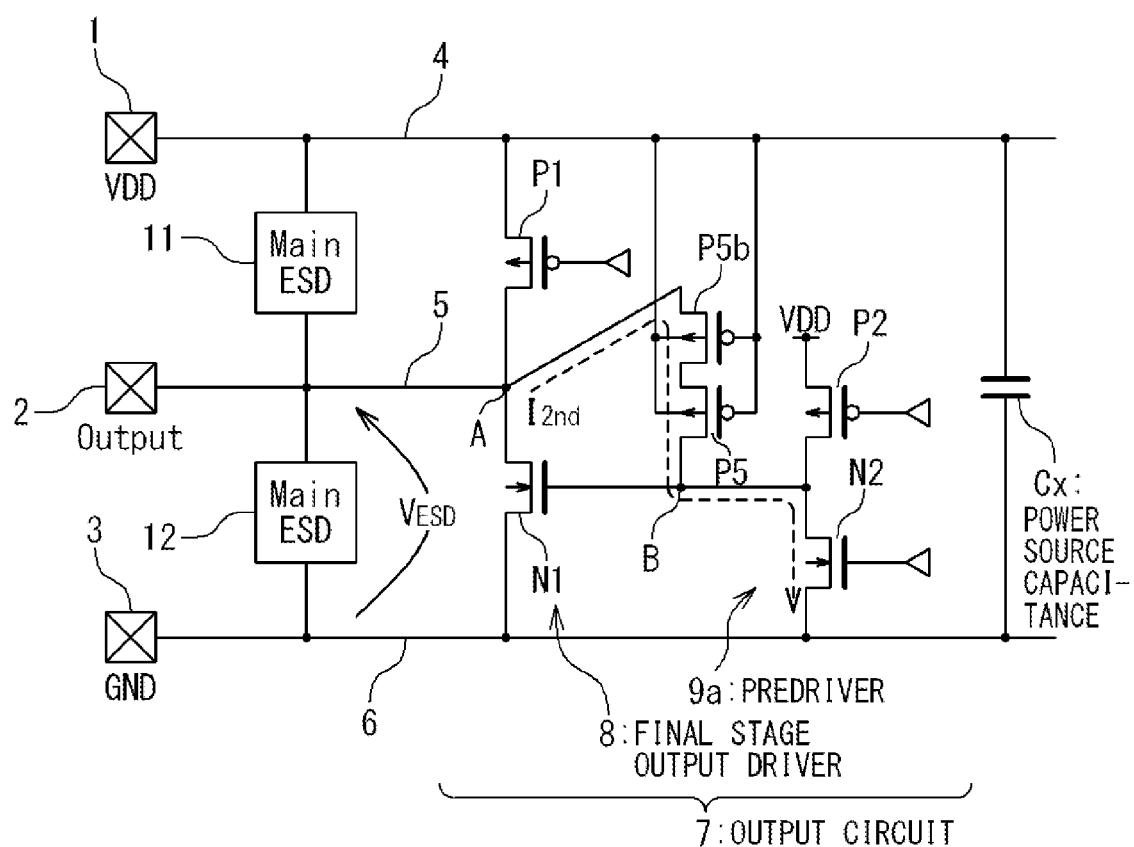
FIG. 9B is a circuit diagram showing another configuration of a semiconductor device according to the third embodiment of the present invention.

Instead of the diode D2, one or a plurality of PMOS transistors may be inserted. FIG. 9B shows a configuration in which one PMOS transistor P5b is inserted between the node A and the node B in series with the PMOS transistor P5. In general, by inserting N number of PMOS transistors P5b, the potential of the node A at which the PMOS transistor P5, P5b operates becomes VDD+(N+1)·Vt, and an erroneous operation can be effectively suppressed.

Figure 10:
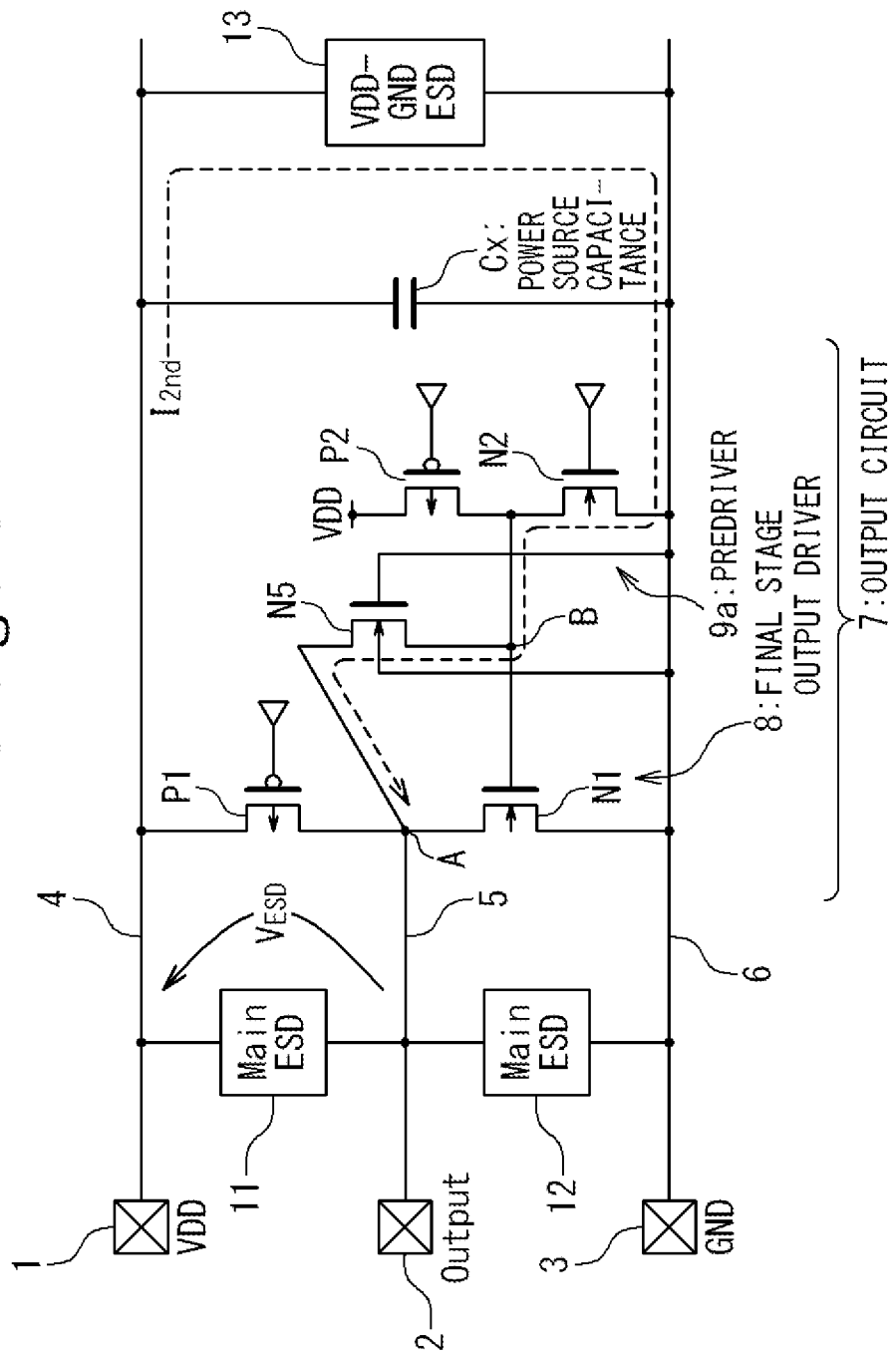
FIG. 10 is a circuit diagram showing a configuration of a semiconductor device according to a fourth embodiment of the present invention.

Fourth Embodiment:

FIG. 10 shows a circuit diagram showing a configuration of a semiconductor circuit according to a fourth embodiment of the present invention. In the fourth embodiment, instead of the PMOS transistor P5, an NMOS transistor N5 is connected between the node A of the signal line 5 and the gate of the NMOS transistor N1 (the node B). The drain of the NMOS transistor N5 is connected to the node A, the source thereof is connected to the node B, and the gate and the back gate thereof are connected to the low potential power source line 6. The NMOS transistor N5 is a sub ESD protection element additionally inserted for the purpose of relaxing a stress voltage applied to the NMOS transistor N1. The NMOS transistor N5 is formed so that a relatively smaller current flows compared with the main ESD protection elements 11, 12.

As for the NMOS transistor N5 which functions as a sub ESD protection element, depending on the operation, there is a case where a higher voltage is applied to the node A than the node B, and also a case where a high voltage is applied to the node B than the node A. Therefore, even a terminal of the NMOS transistor N5 is described as the "source", it merely means that it is one of the "source" and the "drain". It is same for the "drain".

A purpose of the configuration of the present embodiment is to prevent the breaking of the NMOS transistor N1 when an ESD surge between the VDD pad 1 and the signal output pad 2 being positive to the signal output pad 2 is applied to the VDD pad 1. When an ESD surge positive to the signal output pad 2 is applied to the VDD pad 1 and the potential of the high potential power source line 4, caused by the power source capacitance Cx between the high potential power source line 4 and the low potential power source line 6, the potential of the low potential power source line 6 also increases. In this timing, the gate of the NMOS transistor N2 in the predriver 9a is floating, so that there is a case where the NMOS transistor N2 turns on. If the NMOS transistor N2 turns on, caused by the increase of the potential of the low potential power source line 6, a large voltage is applied between the drain-gate of the NMOS transistor N1, and there is a possibility that the NMOS transistor N1 is broken down.

In a configuration of the present embodiment shown in FIG. 10, the NMOS transistor N5 provides a discharge path between the node A of the signal line 5 and the gate of the NMOS transistor N1 so that the breaking down of the NMOS transistor N1 is prevented. More specifically, when an ESD surge positive to the signal output pad 2 is applied to the VDD pad 1, during a discharge occurs through the path through the main ESD protection element 11 or the power source/ground ESD protection element 13 formed between the high potential power source line 4 and the low potential power source line 6 and the main ESD protection element 12, the voltage $V_{ESD}$ between the high potential power source line 4 and the signal line 5 increases. While the voltage $V_{ESD}$ increases, the low potential power source line 6 is pulled to a potential same to the high potential power source line 4 by the power source capacitance Cx. As a result, the potential of the low potential power source line becomes higher than the potential of the signal line 5. When the potential difference between the low potential power source line 6 and the signal line 5 exceeds the threshold voltage Vt of the NMOS transistor N5, the NMOS transistor N5 is turned on and performs the MOS operation.

When the NMOS transistor N5 is turned on, a discharge path is formed from the VDD pad 1, via the high potential power source line 4, the power source/ground ESD protection element 13, the low potential power source line 6, the NMOS transistor N2, and the NMOS transistor N5, to the signal output pad 2. During the discharge current $I_{2nd}$ flows through this discharge path, the potential of the node B drops caused by the channel resistance Rn of the NMOS transistor N2, and the stress voltage $V_{stress}$ applied between the source-drain of the NMOS transistor N1 decreases. As a result, the breaking down of the NMOS transistor N1 is effectively prevented.

Further, as similar to the second embodiment, a resistive element for preventing the NMOS transistor N5 from flowing an excessive discharge current may be inserted. Specifically, as shown in FIG. 11, a resistive element R2 is inserted between the back gate of the NMOS transistor N5 and the low potential power source line 6, and a resistive element R3 is inserted between the node A of the signal line 5 and the gate of the NMOS transistor N1 (node B) in series with the NMOS transistor N5.

Figure 12A:
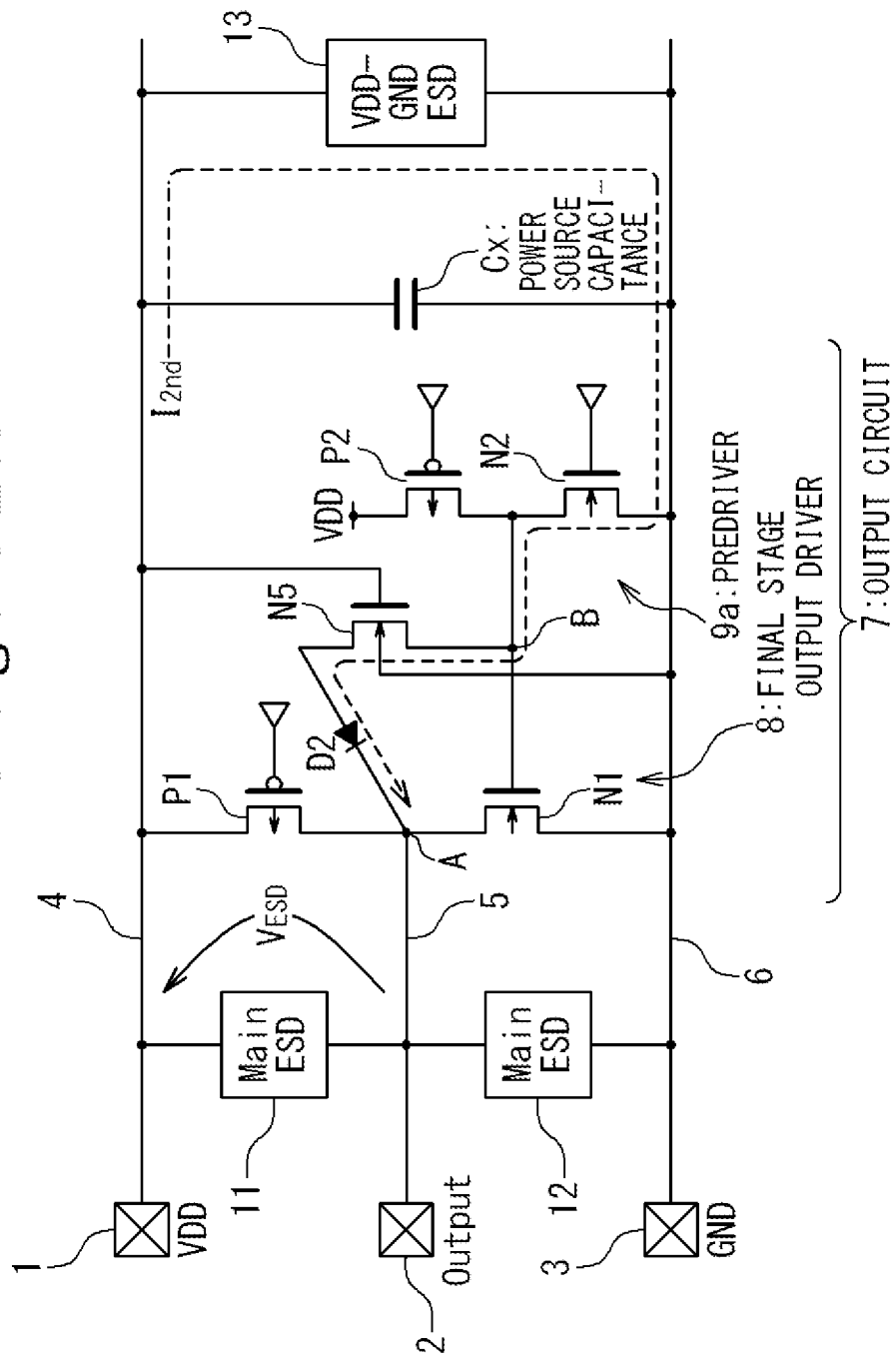
FIG. 12A is a circuit diagram showing further another configuration of a semiconductor device according to the fourth embodiment of the present invention.
Figure 12B:
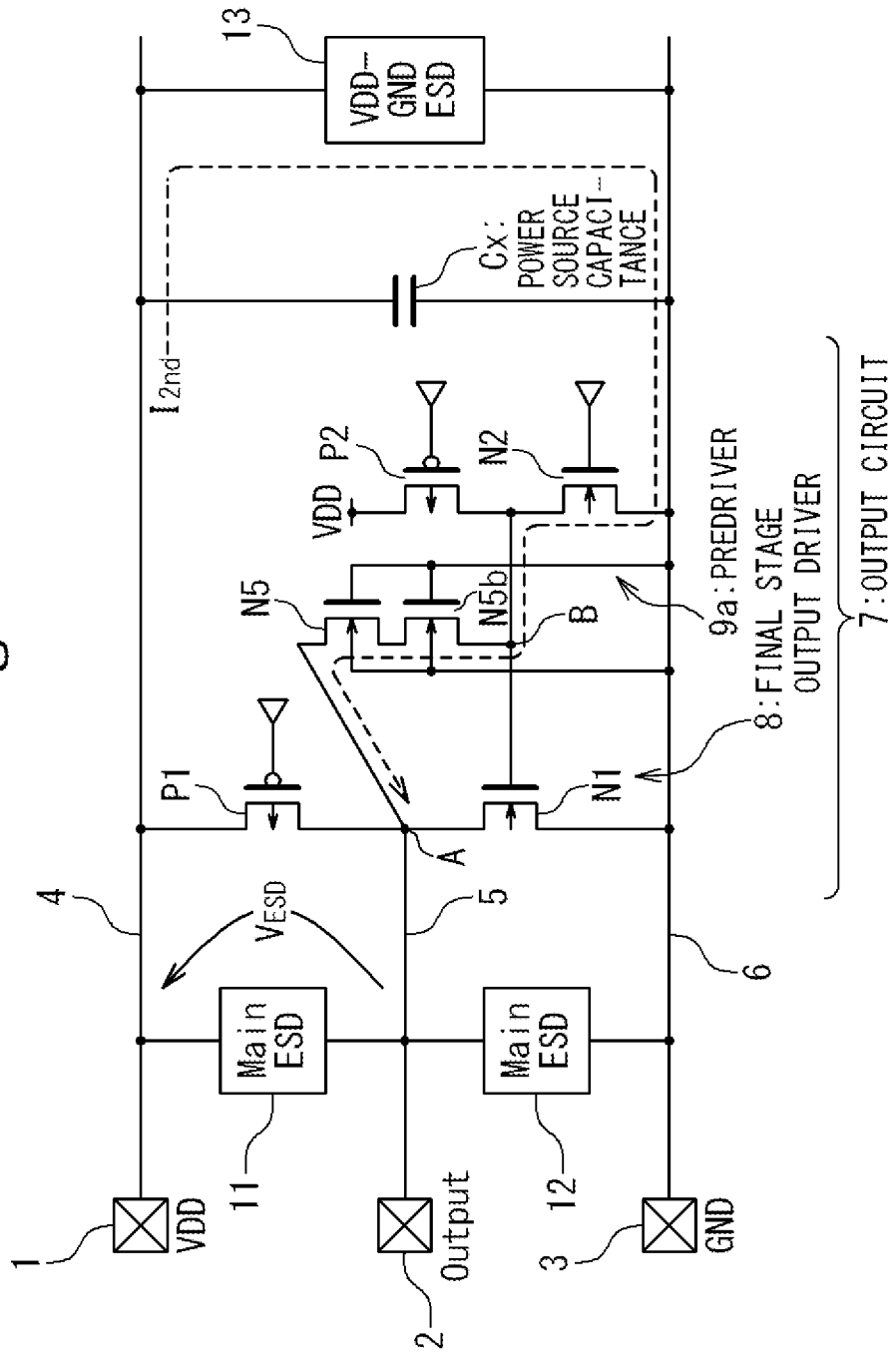
FIG. 12B is a circuit diagram showing further another configuration of a semiconductor device according to the fourth embodiment of the present invention.

Further, as shown in FIG. 12A, similarly to the third embodiment, a diode D2 may be inserted between the node A of the signal line 5 and the gate of the NMOS transistor N1 (node B) in series with the NMOS transistor N5. The diode D2 is inserted so that its forward direction is from the node B to the node A. The diode D2 effectively prevent the NMOS transistor N5 from erroneous operations when the potential of the low potential power source line 6 becomes high caused by a noise or the like. Or one or a plurality of NMOS transistors may be inserted instead of the diode D2 as shown in FIG. 12B. FIG. 12B shows a configuration where one NMOS transistor N5b is inserted between the node A and the node B in series with the NMOS transistor N5.

Figure 13:
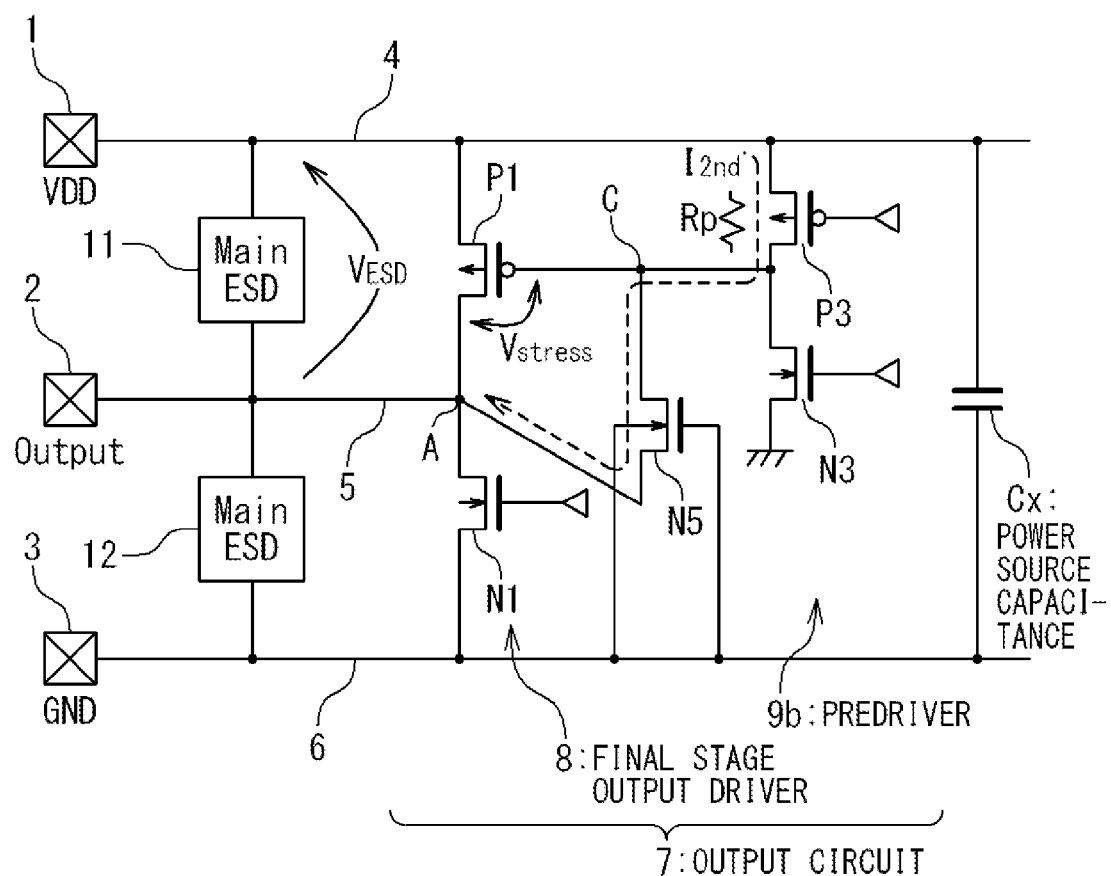
FIG. 13 is a circuit diagram showing a configuration of a semiconductor device according to a fifth embodiment of the present invention.

Fifth Embodiment:

FIG. 13 is a circuit diagram showing a configuration of a semiconductor device according to fifth embodiment of the present invention. In the fifth embodiment, a configuration for protecting the PMOS transistor connected between the high potential power source line 4 and the signal line 5 is provided. More specifically, a predriver 9b consists of the PMOS transistor P3 and the NMOS transistor N3 is connected to the gate of the PMOS transistor P1. The source of the PMOS transistor P3 is connected to the high potential power source line, and the drain thereof is connected to the node C being connected to the gate of the PMOS transistor P1. The PMOS transistor P3 has a function to pull up the gate of the PMOS transistor P1 to the VDD potential. On the other hand, the source of the NMOS transistor N3 is connected to the low potential power source line (ground line), and the drain thereof is connected to the node C. The NMOS transistor N3 has a function to pull down the gate of the PMOS transistor P1 to the GND potential.

In addition, the NMOS transistor N5 which functions as a sub ESD protection element is connected between the node A of the signal line 5 and the gate of the PMOS transistor P1 (the node C). In detail, the source of the NMOS transistor N5 is connected to the node A, and the drain thereof is connected to the node C, and the gate and the back gate thereof are connected to the low potential power source line 6.

A purpose of the configuration of the present embodiment is to prevent the breaking of the PMOS transistor P1 when an ESD surge between the VDD pad 1 and the signal output pad 2 being positive to the signal output pad 2 is applied to the VDD pad 1. When an ESD surge positive to the signal output pad 2 is applied to the VDD pad 1, the potential of the high potential power source line increases. In this timing, the gate of the PMOS transistor P3 of the predriver 9b is floating, so that there is a case where the PMOS transistor P3 is turned on. When the PMOS transistor P3 is turned on, a large voltage is applied between the drain-gate of the PMOS transistor P1, and there is a possibility that the PMOS transistor P1 is broken down. As described below, according to the present embodiment, the breaking of the PMOS transistor P1 is prevented by the NMOS transistor N5 which provides a discharge path between the node A of the signal line 5 and the gate of the PMOS transistor P1 (the node C).

In detail, when an ESD surge positive to the signal output pad 2 is applied to the VDD pad 1, during a discharge occurs at the main ESD protection element 11, the voltage $V_{ESD}$ between the high potential power source line 4 and the signal line 5 increases. While the voltage $V_{ESD}$ increases, the low potential power source line 6 is pulled to the potential same to the high potential power source line 4 by the power source capacitance Cx. As a result, the potential of the low power source line 6 becomes higher than the potential of the signal line 5. When the potential difference between the low potential power source line 6 and the signal line 5 exceeds the threshold voltage Vt of the NMOS transistor N5, the NMOS transistor N5 id turned on and performs the MOS operation.

When the NMOS transistor N5 is turned on, a discharge path is formed from the VDD pad 1, via the high potential power source line 4, the PMOS transistor P3, and the NMOS transistor N5, to the signal output pad 2. When a discharge current $I_{2nd}$ flows through this discharge path, the potential of the node C drops caused by the channel resistance Rp of the PMOS transistor P3, and the stress voltage $V_{stress}$ applied between the source-drain of the PMOS transistor P1 decreases. As a result, the breaking down of the PMOS transistor P1 is effectively prevented.

Figure 14:
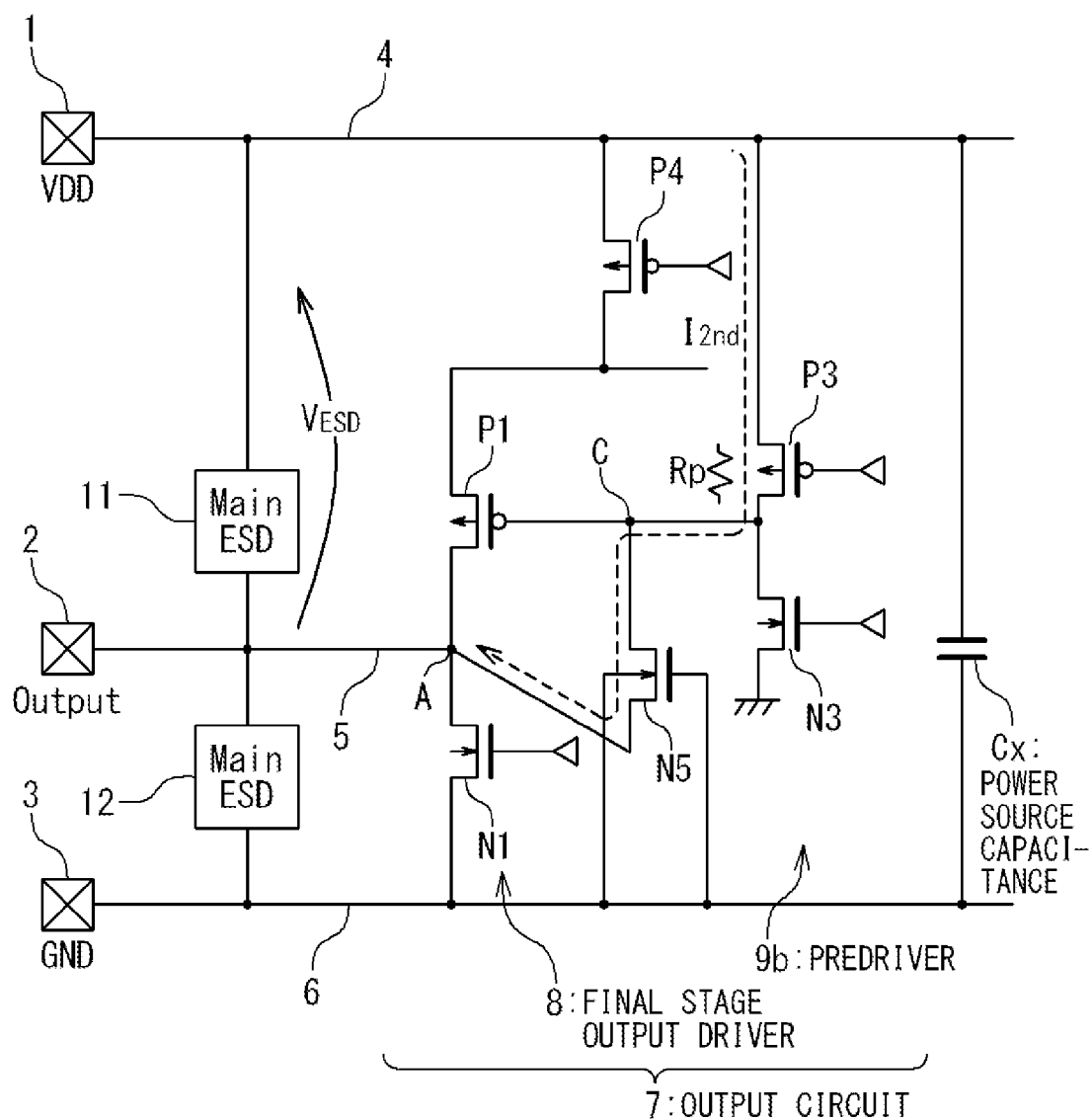
FIG. 14 is a circuit diagram showing another configuration of a semiconductor device according to the fifth embodiment of the present invention.

The above-explained configuration can be applicable to a protection of the PMOS transistor P1 of the final stage stacked output driver 8b shown in FIG. 14 having: PMOS transistors P1, P4 connected between the high potential power source line 4 and the signal line 5 in cascade; and a resistive element R1 between the signal line 5 and the low potential power source line 6. In this configuration, the PMOS transistor P4 functions as a current source, and the resistive element R1 functions as a load.

Further, as similar to the second embodiment, a resistive element for preventing a flow of an excessive discharge current through the NMOS transistor N5 may be inserted. Specifically, a first resistive element may be inserted between the back gate of the NMOS transistor N5 and the low potential power source line 6, and a second resistive element may be inserted between the node A of the signal line 5 and the gate of the PMOS transistor P1 (the node C) in series with the NMOS transistor N5.

Further, as similar to the third embodiment, a diode for preventing erroneous operations of the NMOS transistor N5 may be inserted in series with the NMOS transistor N5. This diode is connected so that its forward direction is from the gate of the PMOS transistor P1 (the node C) to the node A of the signal line 5. Further, instead of the diode, an NMOS transistor whose gate and back gate is connected to the low potential power source line 6 may be inserted in series with the NMOS transistor N5.

Figure 15:
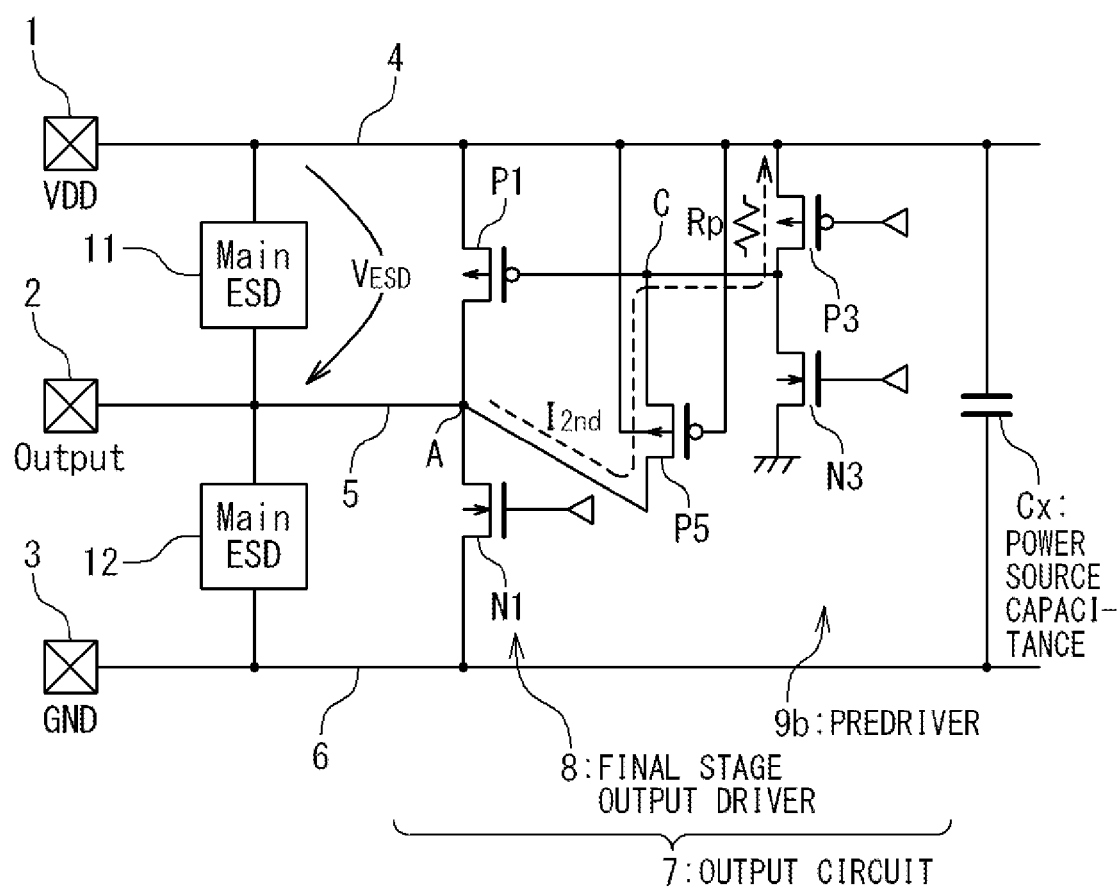
FIG. 15 is a circuit diagram showing a configuration of a semiconductor device according to a sixth embodiment of the present invention.

Sixth Embodiment:

FIG. 15 is a circuit diagram showing a configuration of a semiconductor device according to a sixth embodiment of the present invention. Also in the sixth embodiment, a configuration for protecting the PMOS transistor P1 connected between the high potential power source line 4 and the node A of the signal line 5 is provided. In the sixth embodiment, a PMOS transistor P5 functions as a sub ESD protection element is connected between the node A of the signal line 5 and the gate of the PMOS transistor P1 (the node C). The drain of the PMOS transistor P5 is connected to the node A, and the source thereof is connected to the node C, and the gate and the back gate thereof are connected to the high potential power source line 4.

A purpose of the configuration of the present embodiment is to prevent the breaking of the PMOS transistor P1 when an ESD surge between the VDD pad 1 and the signal output pad 2 being positive to the VDD pad 1 is applied to the signal output pad 2. When an ESD surge being positive to the VDD pad 1 is applied to the signal output pad 2, the potential of the signal line 5 increases. In this timing, the gate of the PMOS transistor P3 in the predriver 9b is floating, so that there is a case that the PMOS transistor P3 turns on. If the PMOS transistor P3 turns on, a large voltage is applied to between the drain-gate of the PMOS transistor P1, and there is a possibility that the PMOS transistor P1 is broken down. As described below, in the present embodiment, the breaking of the PMOS transistor P1 is prevented caused by the PMOS transistor P5 which provides a discharge path between the node A of the signal line 5 and the gate of the PMOS transistor P1 (the node C).

In detail, when an ESD surge being positive to the VDD pad 1 is applied to the signal output pad 2, during a discharge is performed at the main ESD protection element 11, the potential of the signal line 5 increases. When the potential difference between the signal line 5 and the high potential power source line 4 exceeds the threshold voltage Vt of the PMOS transistor P5, the PMOS transistor P5 is turned on, and performs the MOS operation.

When the PMOS transistor P5 is turned on, a discharge path is formed from the signal output pad 2, via the signal line 5, the PMOS transistor P5, the PMOS transistor P3, and the high potential power source line 4, to the VDD pad 1. When a discharge current $I_{2nd}$ flows through this discharge path, the potential of the node C increases caused by the channel resistance Rp of the PMOS transistor P3, the potential of the node C increases, and the stress voltage $V_{stress}$ applied between the source-drain of the PMOS transistor P1 decreases. As a result, the breaking of the PMOS transistor P1 is effectively prevented.

Similarly to the fifth embodiment, such a configuration is applicable to the protection of the PMOS transistor P1 in the final stage stacked output driver 8b as shown in FIG. 14, which has: PMOS transistors connected between the high potential power source line 4 and the signal line 5 in cascade; and a resistive element R1 between the signal line 5 and the low potential power source line 6.

Further, as similar to the second embodiment, also in the present embodiment, a resistive element for preventing a flow of an excessive discharge current through the NMOS transistor N5 may be inserted. Specifically, a first resistive element may be inserted between the back gate of the PMOS transistor P5 and the high potential power source line 4, and a second resistive element may be inserted between the node A of the signal line 5 and the gate of the PMOS transistor P1 (the node C) in series with the PMOS transistor P5.

Further, as similar to the third embodiment, a diode for preventing erroneous operations of the PMOS transistor P5 may be inserted in series with the PMOS transistor P5. This diode is connected so that its forward direction is directed from the node A of the signal line 5 to the gate of the PMOS transistor P1 (the node C). Further, instead of the diode, a PMOS transistor whose gate and back gate is connected to the high potential power source line 4 may be inserted in series with the PMOS transistor P5.

Note that, though various embodiments of the present invention is described in this specification, the present invention is not restricted to those embodiments, and various changes which can be recognized by those skilled in the art can be applied. Further, any combination of the above described various embodiments can be performed in the scope that there is no contradiction. For example, the configuration where an excessive current is suppressed by the resistive elements R2, R3 (FIG. 8) and the configuration where the diode D2 or the PMOS transistor P5b is inserted (FIG. 9B) may simultaneously performed. Also, a circuit configuration where a PMOS transistor is used as a sub ESD protection element and a circuit configuration where an NMOS transistor is used as a sub ESD protection element may be mounted on a single integrated circuit.

What is claimed is:

1. A semiconductor device comprising:
   a high potential power source line;
   a first power source line pad connected to the high potential power source line;
   a low potential power source line;
   a second power source line pad connected to the low potential power source line;
   a signal line;
   a signal pad connected to the signal line;
   a main protection circuit part configured to discharge an ESD surge applied to a first pad which is any of the first power source line pad, the second power source line pad, and the signal pad to a second pad which is any of the first power source line pad, the second power source line pad, and the signal pad and other than the first pad; and
   a sub protection circuit part; and
   a protection target circuit,
   wherein the protection target circuit comprises:
   an output MOS transistor whose drain is connected to the signal line, and whose source is connected to one power source line being one of the high potential power source line and the low potential power source line; and
   a circuit element connected between a gate of the output MOS transistor and the one power source line and configured to function as a resistive element, and
   the sub protection circuit comprises a first PMOS transistor being connected between the signal line and the gate of the output MOS transistor and whose gate and back gate are connected to the high potential power source line.

2. The semiconductor device according to claim 1, wherein the sub protection circuit part further comprises at least one of:
   a second resistive element connected between a back gate of the first PMOS transistor and the high potential power source line; and
   a third resistive element connected between the signal line and the gate of the output MOS transistor and in series with the first PMOS transistor.

3. The semiconductor device according to claim 1, wherein the sub protection circuit part further comprises:
   a diode element connected between the signal line and the gate of the output MOS transistor in series with the first PMOS transistor, and a forward direction of the diode element is directed from the signal line to the gate of the output MOS transistor.

4. The semiconductor device according to claim 1, wherein the sub protection circuit part further comprises:
   a second PMOS transistor connected between the signal line and the gate of the output MOS transistor in series with the first PMOS transistor, and a gate and a back gate of the second PMOS transistor is connected to the high potential power source line.

5. The semiconductor device according to claim 1, wherein the output MOS transistor is a first NMOS transistor, and
   the circuit element comprises a second NMOS transistor whose drain is connected to a gate of the first NMOS transistor, and whose source is connected to the low potential power source line.

6. The semiconductor device according to claim 5, wherein the protection target circuit further comprises:
   a resistive element connected between the signal line and the high potential power source line; and
   a third NMOS transistor connected between the signal line and the low potential power source line in series with the first NMOS transistor and functions as a current source.

7. The semiconductor device according to claim 1, wherein the output MOS transistor is a third PMOS transistor, and
   the circuit element comprises a fourth PMOS transistor whose drain is connected to a gate of the third PMOS transistor, and whose source is connected to the high potential power source line.

8. The semiconductor device according to claim 7, wherein the protection target circuit further comprises:
   a resistive element connected between the signal line and the low potential power source line; and a fifth PMOS transistor connected between the signal line and the high potential power source line in series with the third PMOS transistor and functions as a current source.

9. The semiconductor device according to claim 1, wherein a main protection element formed in the main protection circuit part is configured to be capable of flowing a current larger than the first PMOS transistor.

10. A semiconductor device comprising:
a high potential power source line;
a first power source line pad connected to the high potential power source line;
a low potential power source line;
a second power source line pad connected to the low potential power source line;
a signal line;
a signal pad connected to the signal line;
a main protection circuit part configured to discharge an ESD surge applied to a first pad which is any of the first power source line pad, the second power source line pad, and the signal pad to a second pad which is any of the first power source line pad, the second power source line pad, and the signal pad and other than the first pad; and
a sub protection circuit part; and
a protection target circuit,
wherein the protection target circuit comprises:
an output MOS transistor whose drain is connected to the signal line, and whose source is connected to one power source line being one of the high potential power source line and the low potential power source line; and
a circuit element connected between a gate of the output MOS transistor and the one power source line and configured to function as a resistive element, and
the sub protection circuit comprises a first NMOS transistor being connected between the signal line and the gate of the output MOS transistor and whose gate and back gate are connected to the low potential power source line.

11. The semiconductor device according to claim 10, wherein the sub protection circuit part further comprises at least one of:
a second resistive element connected between the back gate of the first NMOS transistor and the low potential power source line; and
a third resistive element connected between the signal line and the gate of the output MOS transistor in series with the first NMOS transistor.

12. The semiconductor device according to claim 10, wherein the sub protection circuit part further comprises:
a diode element connected between the signal line and the gate of the output MOS transistor in series with the first NMOS transistor, and a forward direction of the diode element is directed from the gate of the output MOS transistor to the signal line.

13. The semiconductor device according to claim 10, wherein the sub protection circuit part further comprises:
a second NMOS transistor connected between the signal line and the gate of the output MOS transistor in series with the first NMOS transistor, and whose gate and back gate is connected to the low potential power source line.

14. The semiconductor device according to claim 10, wherein the output MOS transistor is a first PMOS transistor, and
the circuit element comprises a second PMOS transistor whose drain is connected to the gate of the first PMOS transistor, and whose source is connected to the high potential power source line.

15. The semiconductor device according to claim 14, wherein the protection target circuit further comprises:
a resistive element connected between the signal line and the low potential power source line; and
a third PMOS transistor connected between the signal line and the high potential power source line in series with the first PMOS transistor and functions as a current source.

16. The semiconductor device according to claim 8, wherein the output MOS transistor is a third NMOS transistor, and
the circuit element comprises a fourth NMOS transistor whose drain is connected to the third NMOS transistor and whose source is connected to the low potential power source line.

17. The semiconductor device according to claim 16, wherein the protection target circuit further comprises:
a resistive element connected between the signal line and the high potential power source line; and
a fifth NMOS transistor connected between the signal line and the low potential power source line in series with the third NMOS transistor and functions as a current source.

18. The semiconductor device according to claim 10, wherein a main protection element formed in the main protection circuit part is configured to be capable of flowing a current larger than the first NMOS transistor.

* * * * *